(12) United States Patent
Minamikawa et al.

(10) Patent No.: US 11,056,557 B2
(45) Date of Patent: Jul. 6, 2021

(54) SEMICONDUCTOR DEVICE INCLUDING A SEMI-INSULATING LAYER CONTACTING A FIRST REGION AT A FIRST SURFACE OF A SEMICONDUCTOR LAYER

(71) Applicants: KABUSHIKI KAISHA TOSHIBA, Tokyo (JP); TOSHIBA ELECTRONIC DEVICES & STORAGE CORPORATION, Tokyo (JP)

(72) Inventors: Kazuki Minamikawa, Ishikawa (JP); Yukie Nishikawa, Ishikawa (JP); Kotaro Zaima, Ishikawa (JP)

(73) Assignees: KABUSHIKI KAISHA TOSHIBA, Tokyo (JP); TOSHIBA ELECTRONIC DEVICES & STORAGE CORPORATION, Tokyo (JP)

( * ) Notice: Subject to any disclaimer, the term of this patent is extended or adjusted under 35 U.S.C. 154(b) by 58 days.

(21) Appl. No.: 16/552,699

(22) Filed: Aug. 27, 2019

(65) Prior Publication Data
US 2020/0295128 A1   Sep. 17, 2020

(30) Foreign Application Priority Data

Mar. 14, 2019   (JP) .............................. JP2019-047140

(51) Int. Cl.
*H01L 29/06*   (2006.01)
*H01L 29/861*   (2006.01)
(Continued)

(52) U.S. Cl.
CPC ........ *H01L 29/063* (2013.01); *H01L 29/7397* (2013.01); *H01L 29/7813* (2013.01); *H01L 29/861* (2013.01)

(58) Field of Classification Search
CPC .............. H01L 29/063; H01L 29/7397; H01L 29/1095; H01L 29/66128; H01L 29/7805;
(Continued)

(56) References Cited

U.S. PATENT DOCUMENTS 8,680,538 B2 * 3/2014 Tarui ................... H01L 23/3192
257/77
2011/0309464 A1  12/2011 Yamamoto et al.
(Continued)

FOREIGN PATENT DOCUMENTS

JP   2012009502 A   1/2012
JP   2017139292 A   8/2017

*Primary Examiner* — Khiem D Nguyen
(74) *Attorney, Agent, or Firm* — Kim & Stewart LLP

(57) ABSTRACT

A semiconductor device includes a semiconductor layer on a first electrode. The semiconductor layer includes a first region of a first type, a second region of a second type, a third region of the second type, and a fourth region of the first type. The second region is above the first region. The third region surrounds the second region. The fourth region surrounds the third region. The second electrode includes a first portion above the second region and a second portion surrounding the first portion. The third electrode surrounds the second electrode and is electrically connected to the fourth region. The semi-insulating layer is electrically connected to the second electrode and the third electrode. A first end portion of the first insulating layer is above the third region.

20 Claims, 9 Drawing Sheets

(51) Int. Cl.
*H01L 29/739* (2006.01)
*H01L 29/78* (2006.01)

(58) Field of Classification Search
CPC .............. H01L 29/405; H01L 29/7811; H01L 29/7813; H01L 29/417; H01L 29/8611; H01L 29/861; H01L 29/0634; H01L 29/0696; H01L 29/4236; H01L 29/66734; H01L 29/0623; H01L 23/3192; H01L 29/407
See application file for complete search history.

(56) References Cited

U.S. PATENT DOCUMENTS

| | | | |
|---|---|---|---|
| 2013/0062624 A1* | 3/2013 | Tsuchiya | H01L 29/7806 257/77 |
| 2013/0288467 A1 | 10/2013 | Ebiike et al. | |
| 2016/0268193 A1* | 9/2016 | Nishikawa | H01L 21/76877 |
| 2016/0293423 A1* | 10/2016 | Yamada | H01L 21/0475 |
| 2017/0077238 A1* | 3/2017 | Kono | H01L 29/1608 |
| 2017/0365709 A1* | 12/2017 | Ohashi | H01L 29/086 |

* cited by examiner

US 11,056,557 B2

SEMICONDUCTOR DEVICE INCLUDING A SEMI-INSULATING LAYER CONTACTING A FIRST REGION AT A FIRST SURFACE OF A SEMICONDUCTOR LAYER

CROSS-REFERENCE TO RELATED APPLICATION

This application is based upon and claims the benefit of priority from Japanese Patent Application No. 2019-047140, filed Mar. 14, 2019, the entire contents of which are incorporated herein by reference.

FIELD

Embodiments described herein relate generally to a semiconductor device.

BACKGROUND

A semiconductor device such as a diode, a Metal Oxide Semiconductor Field Effect Transistor (MOSFET), and an Insulated Gate Bipolar Transistor (IGBT) can be used for power conversion and the like. In reliability tests of such devices in which a voltage is applied over time at room temperature or elevated temperatures, the breakdown voltage may decrease.

DETAILED DESCRIPTION

Figure 1:
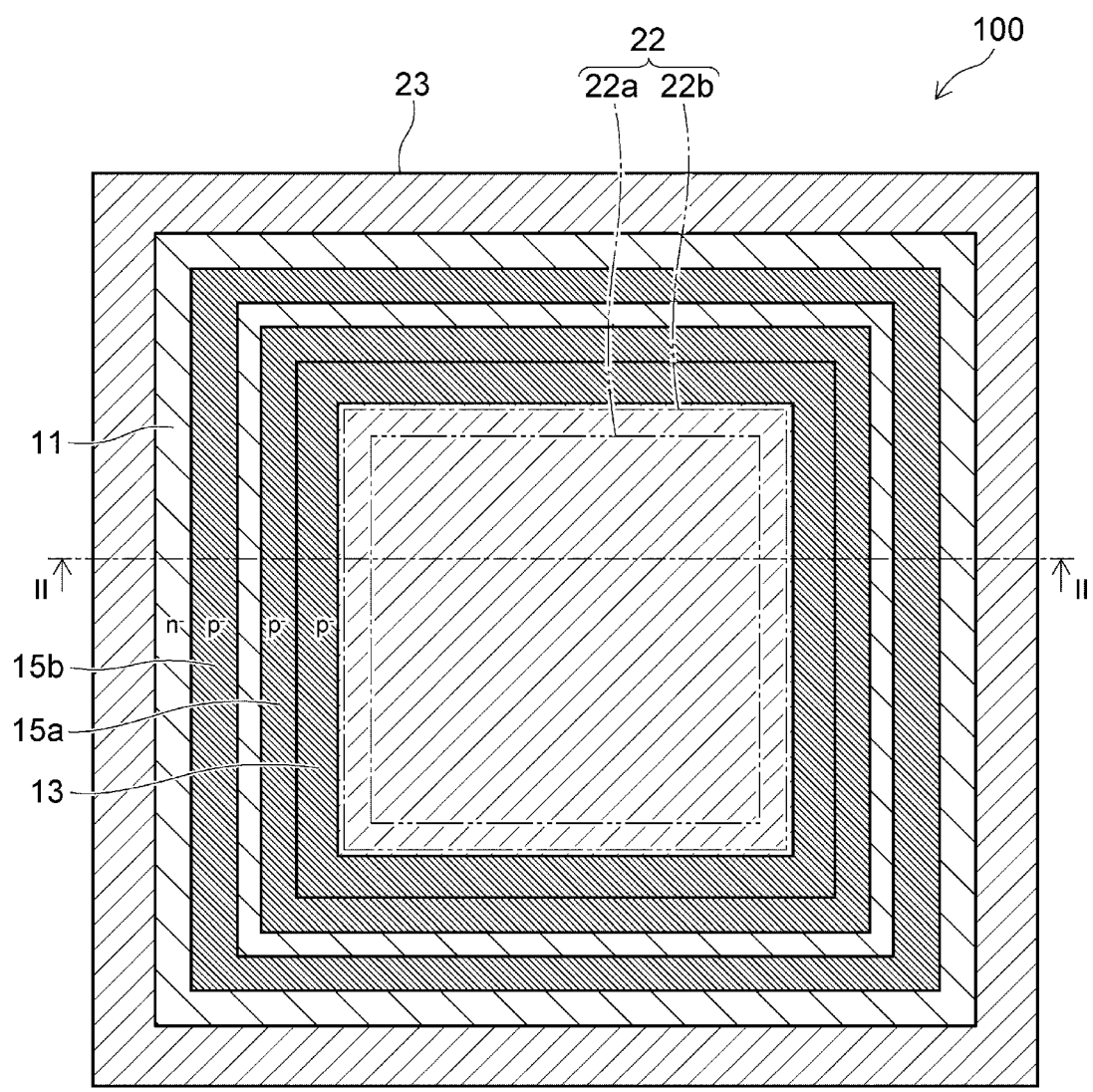
FIG. 1 is a plan view showing a semiconductor device according to an embodiment.

In general, according to one embodiment, a semiconductor device comprises a first electrode and a semiconductor layer on the first electrode. The semiconductor layer includes: a first region of a first conductivity type electrically connected to the first electrode; a second region of a second conductivity type on the first semiconductor region at a first surface of the semiconductor layer; a third region of a second conductivity type at the first surface and contacting the second region, the third region surrounding the second region in a first plane parallel to the first surface and having an impurity concentration less than that of the second region; and a fourth region of the first conductivity type at the first surface and surrounding the third region in the first plane. The fourth region is spaced from the third region in a first direction that is parallel to the first plane and has an impurity concentration greater than that of the first region. A second electrode is on the first surface and electrically connected to the second region. The second electrode includes a first portion above the second region in a second direction that is orthogonal to the first plane and a second portion surrounding the first portion in a second plane parallel to the first plane. A third electrode is on the first surface and surrounds the second electrode in the second plane. The third electrode is spaced from the second electrode in the first direction and electrically connected to the fourth region. A semi-insulating layer contacts the first region at the first surface between the second and fourth regions. The semi-insulating layer also contacts the second electrode and the third electrode. A first insulating layer is between the second portion of the second electrode and the third region in the second direction and contacts the first surface. A first end portion of the first insulating layer that is separated from the second electrode in the first direction towards the third electrode is above the third region in the second direction. Hereinafter, example embodiments of the present disclosure will be described with reference to the drawings.

The drawings are schematic and conceptual, and a relationship between a thickness and a width of each portion, a size ratio between the portions, and the like are not necessarily the same as those in an actual device. Even the same portions may be illustrated with different dimensions and ratios in different drawings.

In the present specification and the drawings, the same elements as those already described are denoted by the same reference numerals, and the detailed description will be appropriately omitted.

In the following description and drawings, notation of $n^+$, n, $n^-$, $p^+$, p, and $p^-$ represents a relative level of impurity concentration by impurity type. That is, the notation with "+" indicates that the impurity concentration is relatively higher than that of the notation without "+" or "−". The notation with "−" indicates that the impurity concentration is relatively lower than that of the notation without any designation. When each region contains both a p type impurity and an n type impurity, these notations represent a relative level of a net impurity concentration.

For each embodiment described below, the embodiment may also be implemented by switching the described p type and n type of each semiconductor region to the opposite type.

FIG. 1 is a plan view showing a semiconductor device according to an embodiment.

Figure 2:
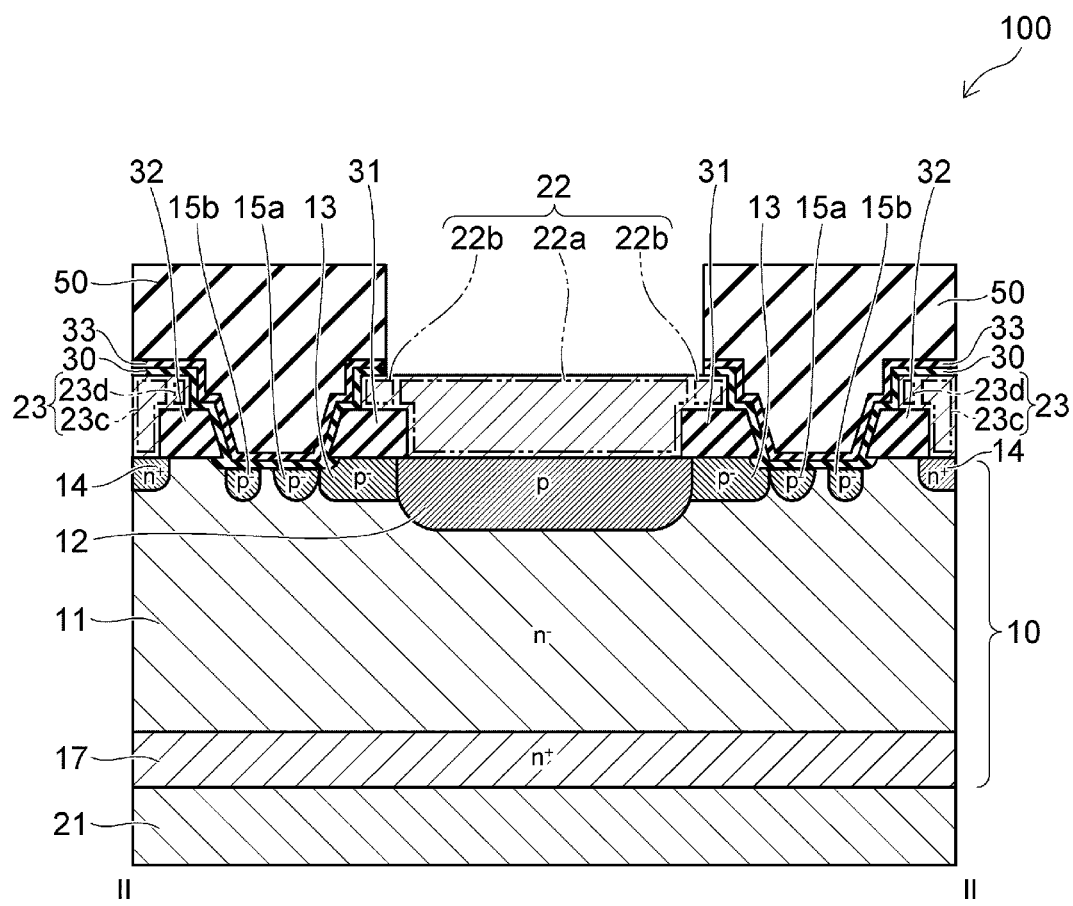
FIG. 2 is a cross-sectional view taken along a line II-II in FIG. 1.

FIG. 2 is a cross-sectional view taken along a line II-II in FIG. 1.

In FIG. 1, a semi-insulating layer 30, a first insulating layer 31, a second insulating layer 32, a third insulating layer 33, and a sealing portion 50 are not specifically depicted (but see FIG. 2).

The semiconductor device 100 shown in FIGS. 1 and 2 is a diode. As shown in FIG. 2, the semiconductor device 100 includes a semiconductor layer 10, a lower electrode 21, an upper electrode 22, an Equivalent-Potential Ring (EQPR) electrode 23, the semi-insulating layer 30, the first insulating layer 31, the second insulating layer 32, the third insulating layer 33, and the sealing portion 50.

The semiconductor layer 10 includes an $n^-$ type semiconductor region 11 (a first semiconductor region), a p type semiconductor region 12 (a second semiconductor region), a $p^-$ type RESURF region 13 (a third semiconductor region), an n⁺ type semiconductor region 14 (a fourth semiconductor region), a p⁻ type guard ring region 15a (a fifth semiconductor region), a p⁻ type guard ring region 15b, and an n⁺ type semiconductor region 17.

In the description of the embodiment, an XYZ orthogonal coordinate system is used for convenience. The direction from the lower electrode 21 to the semiconductor layer 10 is referred to as a Z direction. Two directions which are perpendicular to the Z direction and are orthogonal to each other are referred to as an X direction and a Y direction. In addition, for the sake of explanation, a direction from the lower electrode 21 towards the semiconductor layer 10 is referred to as "upper", and the opposite direction is referred to as "lower". These directions notations are not necessarily related to a direction of gravity, but rather refer the relative positional relationship between the lower electrode 21 and the semiconductor layer 10 and other elements so described.

The lower electrode 21 is provided on a lower surface of the semiconductor device 100. The n⁺ type semiconductor region 17 is provided above the lower electrode 21 and is electrically connected to the lower electrode 21. The n⁻ type semiconductor region 11 is provided above the n⁺ type semiconductor region 17. The n⁻ type semiconductor region 11 is electrically connected to the lower electrode 21 via the n⁺ type semiconductor region 17. The n type impurity concentration in the n⁻ type semiconductor region 11 is lower than the n type impurity concentration in the n⁺ type semiconductor region 17.

The p type semiconductor region 12 is provided above the n⁻ type semiconductor region 11. The p type semiconductor region 12 is provided, for example, in a central portion in the X direction and the Y direction of the semiconductor layer 10. The p⁻ type RESURF region 13 is provided surrounding the p type semiconductor region 12 in an X-Y plane (also referred to as a first plane). The p⁻ type RESURF region 13 is in contact with the p type semiconductor region 12. The p type impurity concentration in the p⁻ type RESURF region 13 is lower than the p type impurity concentration in the p type semiconductor region 12.

The n⁺ type semiconductor region 14 is provided surrounding the p⁻ type RESURF region 13 in the X-Y plane. The n⁺ type semiconductor region 14 is spaced away from the p⁻ type RESURF region 13, that is does not directly contact the p⁻ type RESURF region 13. The n type impurity concentration in the n⁺ type semiconductor region 14 is higher than the n type impurity concentration in the n⁻ type semiconductor region 11. For example, the n⁺ type semiconductor region 14 is provided in an outer peripheral portion of the semiconductor layer 10.

The upper electrode 22 is electrically connected to the p type semiconductor region 12. Specifically, the upper electrode 22 includes a first electrode portion 22a and a second electrode portion 22b. The first electrode portion 22a is provided above the p type semiconductor region 12. That is, the first electrode portion 22a overlaps the p type semiconductor region 12 when viewed from the Z direction. The second electrode portion 22b is provided surrounding the first electrode portion 22a in an X-Y plane. The second electrode portion 22b is spaced away from the semiconductor layer 10 in the Z direction. When viewed from the Z direction, the second electrode portion 22b overlaps (is above) the p⁻ type RESURF region 13, and an outer peripheral edge of the second electrode portion 22b is located inside of an outer peripheral edge of the p⁻ type RESURF region 13.

The EQPR electrode 23 is provided around the upper electrode 22 along the X-Y plane. The EQPR electrode 23 is located above the n⁺ type semiconductor region 14 and is electrically connected to the n⁺ type semiconductor region 14. The EQPR electrode 23 includes, for example, a third electrode portion 23c and a fourth electrode portion 23d. The third electrode portion 23c overlaps the n⁺ type semiconductor region 14 when viewed from the Z direction. The fourth electrode portion 23d is spaced away from the semiconductor layer 10 in the Z direction. The third electrode portion 23c is provided around the fourth electrode portion 23d along the X-Y plane. When viewed from the Z direction, an inner periphery edge of the fourth electrode portion 23d is located inside an inner periphery edge of the n⁺ type semiconductor region 14.

The p⁻ type guard ring region 15a is provided around the p⁻ type RESURF region 13 along the X-Y plane. The p⁻ type guard ring region 15b is provided around the p⁻ type guard ring region 15a along the X-Y plane. The p⁻ type guard ring region 15a and the p⁻ type guard ring region 15b are located inside of the n⁺ type semiconductor region 14, that is the p⁻ type guard ring region 15a and the p⁻ type guard ring region 15b closer to a central portion of p type semiconductor region 12 than is the n⁺ type semiconductor region 14. The p⁻ type guard ring region 15a is in contact with, for example, the p⁻ type RESURF region 13 and is separated from the n⁺ type semiconductor region 14. The p⁻ type guard ring region 15b is separated from the p⁻ type guard ring region 15a and the n⁺ type semiconductor region 14.

Each of the p type impurity concentration in the p⁻ type guard ring region 15a and the p type impurity concentration in the p⁻ type guard ring region 15b is lower than the p type impurity concentration in the p type semiconductor region 12. The p type impurity concentration in the p⁻ type guard ring region 15a and the p type impurity concentration in the p⁻ type guard ring region 15b may be the same as the p type impurity concentration in the p⁻ type RESURF region 13 or may be lower than the p type impurity concentration in the p⁻ type RESURF region 13. A plurality of p⁻ type guard ring regions 15b may be provided spaced from each other in a radial direction from the upper electrode 22 to the EQPR electrode 23.

The semi-insulating layer 30 is electrically connected to the upper electrode 22 and the EQPR electrode 23. The semi-insulating layer 30 is in contact with an upper surface of the semiconductor layer 10 between the p type semiconductor region 12 and the n⁺ type semiconductor region 14. For example, the semi-insulating layer 30 is in contact with a part of the upper surface of the n⁻ type semiconductor region 11, a part of the upper surface of the p⁻ type RESURF region 13, and an upper surface of each of the p⁻ type guard ring region 15a and the p⁻ type guard ring region 15b.

The first insulating layer 31 is provided between the semiconductor layer 10 and the second electrode portion 22b in the Z direction. In other words, the first insulating layer 31 is provided between an outer periphery of the p type semiconductor region 12 and an outer periphery of the upper electrode 22. The second insulating layer 32 is provided between an inner periphery of the n⁺ type semiconductor region 14 and an inner periphery of the EQPR electrode 23. The first insulating layer 31 and the second insulating layer 32 are thicker than the semi-insulating layer 30.

The third insulating layer 33 covers the semi-insulating layer 30. The third insulating layer 33 functions as, for example, a protective layer for protecting the semiconductor layer 10 and the semi-insulating layer 30. The sealing portion 50 is provided above the third insulating layer 33 and seals a part of the upper surface of the semiconductor device 100.

The electrical resistance of the semi-insulating layer 30 is lower than the electrical resistance of the third insulating layer 33. For example, the resistivity of the semi-insulating layer 30 is more than or equal to $1.0 \times 10^8$ [Ω·cm] and less than $1.0 \times 10^{13}$ [Ω·cm]. The resistivity of the third insulating layer 33 is more than or equal to $1.0 \times 10^{13}$ [Ω·cm].

Figure 3:
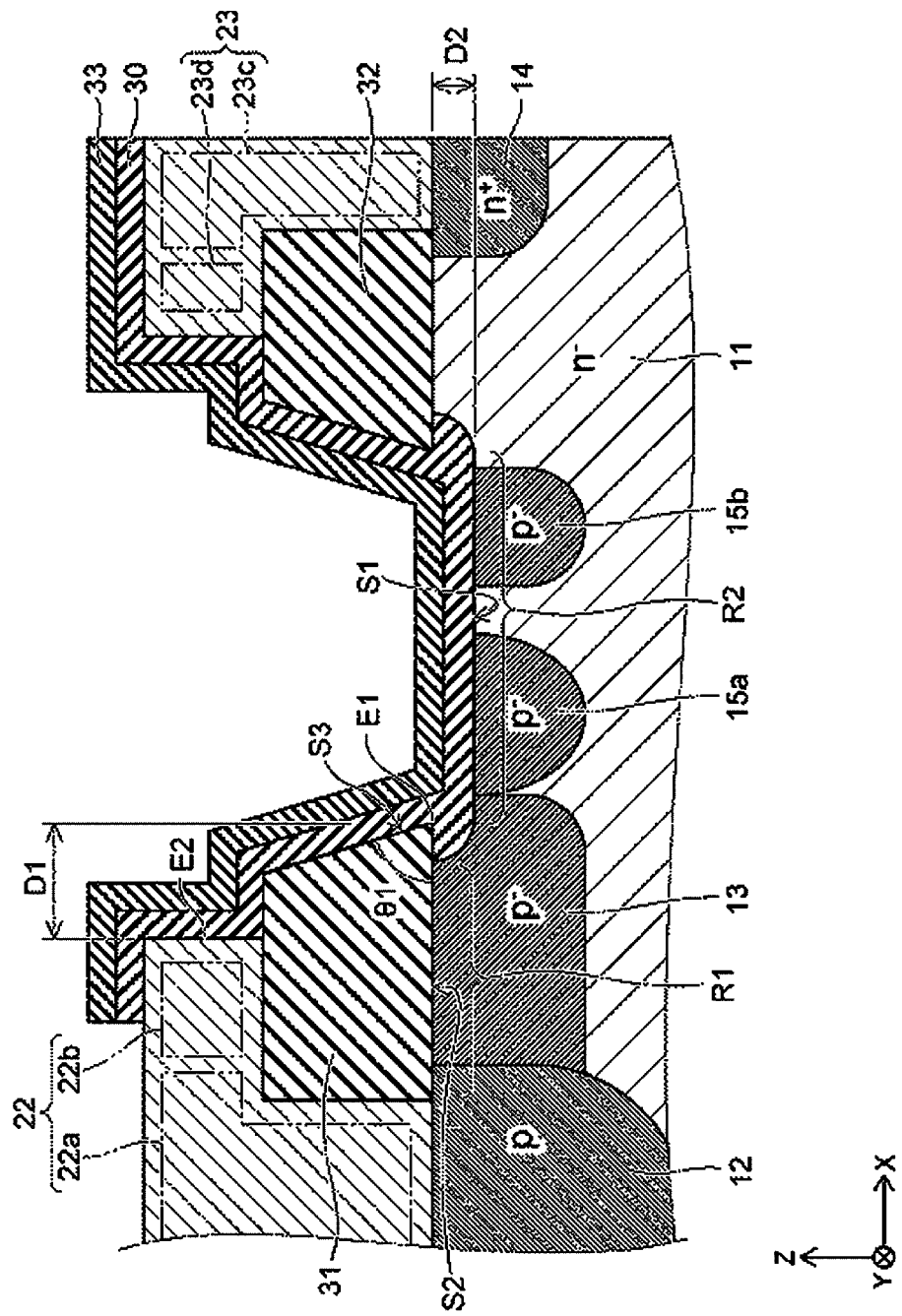
FIG. 3 is an enlarged cross-sectional view of a portion of FIG. 2.

FIG. 3 is an enlarged cross-sectional view of a part in FIG. 2.

As shown in FIG. 3, the semi-insulating layer 30 has a first lower surface S1 along the X direction and the Y direction. The first lower surface S1 is in contact with the n⁻ type semiconductor region 11. In the example of FIG. 3, the first lower surface S1 is further in contact with the p⁻ type guard ring region 15a and the p⁻ type guard ring region 15b. The first insulating layer 31 has a second lower surface S2 along the X direction and the Y direction. At least a part of the second lower surface S2 is in contact with the p type semiconductor region 12 and the p⁻ type RESURF region 13 of the semiconductor layer 10. A first end portion E1 of the second lower surface S2 in the radial direction from the upper electrode 22 to the EQPR electrode 23 is provided above the p⁻ type RESURF region 13. For example, the first end portion E1 is separated from the p⁻ type RESURF region 13 in the Z direction. A part of the semi-insulating layer 30 is provided between the first end portion E1 and the p⁻ type RESURF region 13.

The first insulating layer 31 further has a side surface S3. The side surface S3 is inclined with respect to the second lower surface S2 and intersects with the radial direction. The side surface S3 is connected to the second lower surface S2 at the first end portion E1. The side surface S3 is in contact with the semi-insulating layer 30. An angle θ1 between the second lower surface S2 and the side surface S3 is, for example, more than or equal to 50 degrees.

A second end portion E2 in the radial direction of the second electrode portion 22b overlaps the first insulating layer 31 in the Z direction. In other words, when viewed from the Z direction, the second end portion E2 is provided on an inner side of the semiconductor device 100 than the first end portion E1. A distance D1 in the radial direction between a position of the first end portion E1 in the radial direction and a position of the second end portion E2 in the radial direction is, for example, less than or equal to 15 μm.

The upper surface of the semiconductor layer 10 includes a first region R1 and a second region R2 along the X-Y plane. The first region R1 is in contact with the second lower surface S2. The second region R2 is located below the first region R1. The second region R2 is in contact with the first lower surface S1. The first region R1 includes a part of the upper surface of the p type semiconductor region 12 and a part of the upper surface of the p⁻ type RESURF region 13. The second region R2 includes another part of the upper surface of the p⁻ type RESURF region 13, the upper surface of the p⁻ type guard ring region 15a, and the upper surface of the p⁻ type guard ring region 15b.

A distance in the Z direction between a position of the first lower surface S1 in the Z direction and a position of the second lower surface S2 in the Z direction is, for example, more than or equal to 50 nm and less than or equal to 150 nm. In other words, a distance D2 in the Z direction between a position of the first region R1 in the Z direction and a position of the second region R2 in the Z direction is, for example, more than or equal to 50 nm and less than or equal to 150 nm.

An example of the material of each component will be described.

The semiconductor layer 10 contains silicon, silicon carbide, gallium nitride, or gallium arsenide as a semiconductor material. When silicon is used as the semiconductor material, arsenic, phosphorus or antimony may be used as the n type impurity. Boron may be used as the p type impurity.

The lower electrode 21, the upper electrode 22, and the EQPR electrode 23 include a metal such as aluminum.

The semi-insulating layer 30 includes silicon nitride. The first insulating layer 31 and the second insulating layer 32 include silicon oxide. The third insulating layer 33 includes silicon nitride.

The sealing portion 50 includes an insulating resin such as polyimide.

In order to enhance the function of the third insulating layer 33 as a protective film, a ratio of a content of silicon to a content of nitrogen in the third insulating layer 33 is preferably close to a stoichiometric ratio. In order to reduce the electrical resistance, the semi-insulating layer 30 preferably contains more silicon than the third insulating layer 33. That is, a ratio of a content of silicon to a content of nitrogen in the semi-insulating layer 30 is larger than the ratio of the content of silicon to the content of nitrogen in the third insulating layer 33.

The content of nitrogen in the semi-insulating layer 30 is represented by $C1_N$, the content of silicon in the semi-insulating layer 30 by $C1_{Si}$, the content of nitrogen in the third insulating layer 33 by $C2_N$, and the content of silicon in the third insulating layer 33 by $C2_{Si}$. The ratio $C1_{Si}/C1_N$ is greater than 0.75 (the stoichiometric ratio). A value obtained by subtracting 0.75 from the ratio $C1_{Si}/C1_N$ is greater than a value obtained by subtracting 0.75 from a ratio $C2_{Si}/C2_N$. In order to provide the resistivity described above, the ratio $C1_{Si}/C1_N$ is preferably more than or equal to 1.0 and less than or equal to 1.5. The ratio $C2_{Si}/C2_N$ is preferably more than or equal to 0.7 and less than or equal to 0.95.

An operation of the semiconductor device 100 will be described.

When a positive voltage, relative to the lower electrode 21, equal to or higher than a built-in potential is applied to the upper electrode 22, a forward current flows from the upper electrode 22 to the lower electrode 21. When a positive voltage, relative to the upper electrode 22 is applied to the lower electrode 21, a depletion layer spreads from an interface between the n⁻ type semiconductor region 11 and the p type semiconductor region 12, and electric conduction between the lower electrode 21 and the upper electrode 22 is prevented.

When a positive voltage, relative to the upper electrode 22, is applied to the lower electrode 21 (at less than the breakdown voltage), the potential at each point in the semiconductor layer 10 increases as the distance from the p type semiconductor region 12 increases. The potential of the n⁺ type semiconductor region 14 spaced away from the p type semiconductor region 12 along the X-Y plane is substantially the same as the potential of the lower electrode 21. Therefore, a minute (small) current flows from the EQPR electrode 23 to the upper electrode 22 in the semi-insulating layer 30. When this minute current flows through the semi-insulating layer 30, bias of an electric field in the region outside the p type semiconductor region 12 is alleviated. Further, it is possible to prevent ions and the like contained in the sealing portion 50 from flowing into the semiconductor layer 10. The breakdown voltage of the semiconductor device 100 can be improved (increased) through these actions.

An example of a method for manufacturing the semiconductor device 100 according to the embodiment will be described with reference to FIGS. 4A and 4B, FIGS. 5A and 5B, and FIG. 6.

FIGS. 4A and 4B, FIGS. 5A and 5B, and FIG. 6 are process cross-sectional views showing a manufacturing process of the semiconductor device according to the embodiment.

Figure 4A:
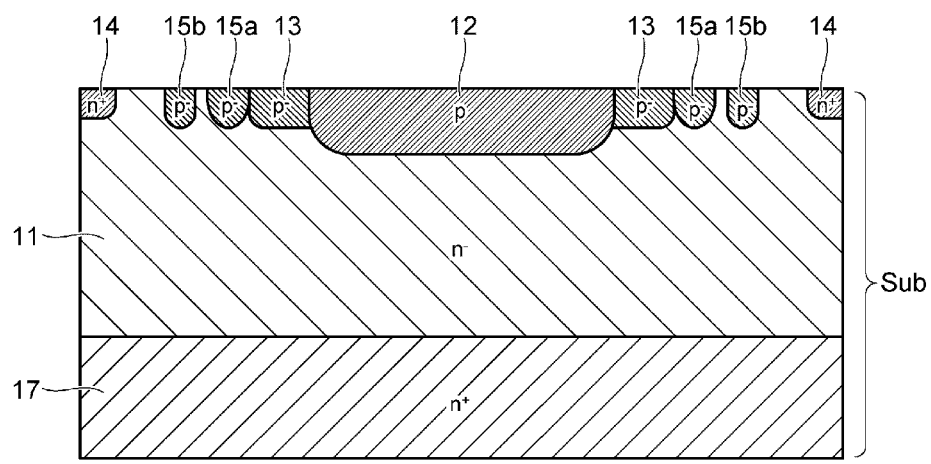
FIGS. 4A and 4B are cross-sectional views depicting aspects of a manufacturing process of a semiconductor device according to an embodiment.

A semiconductor substrate Sub is prepared. The semiconductor substrate Sub includes an $n^+$ type semiconductor region 17 and an $n^-$ type semiconductor region 11 provided above the $n^+$ type semiconductor region 17. As shown in FIG. 4A, the p type impurity and the n type impurity are sequentially ion-implanted into the surface of the $n^-$ type semiconductor region 11 to form the p type semiconductor region 12, the $p^-$ type RESURF region 13, the $n^+$ type semiconductor region 14, the $p^-$ type guard ring region 15a, and the $p^-$ type guard ring region 15b.

Figure 4B:
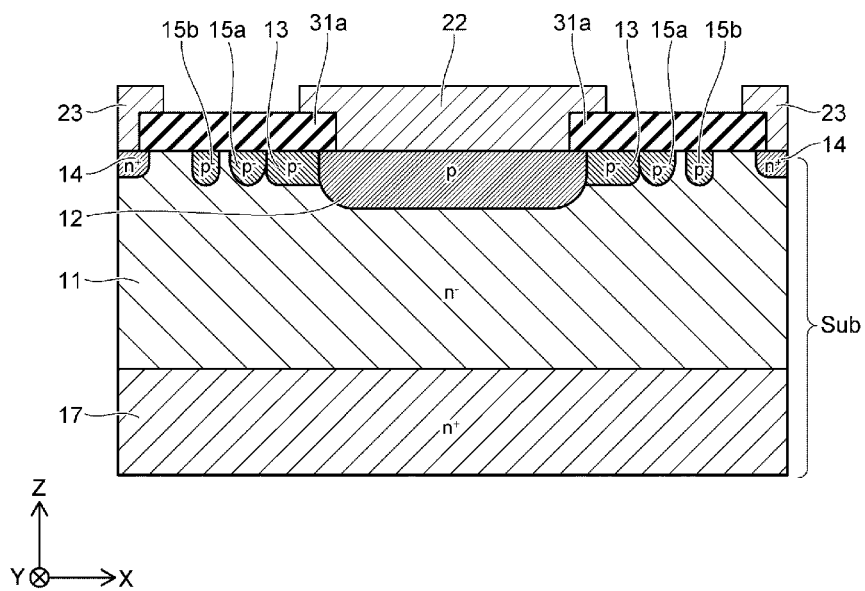

An insulating layer 31a is formed on the semiconductor substrate Sub by chemical vapor deposition (CVD). A part of the insulating layer 31a is removed by reactive ion etching (RIE) to expose a portion excluding the outer peripheral portion of the p type semiconductor region 12 and an outer peripheral portion of the $n^+$ type semiconductor region 14. A metal layer that covers the insulating layer 31a is formed by sputtering. As shown in FIG. 4B, a portion of the metal layer is removed by wet etching to form the upper electrode 22 electrically connected to the p type semiconductor region 12 and the EQPR electrode 23 electrically connected to $n^+$ type semiconductor region 14.

A resist PR that covers the upper electrode 22 and the EQPR electrode 23 is formed. The resist PR includes an opening OP. The opening OP is formed around the upper electrode 22 along the X-Y plane and located on an inner side of the EQPR electrode 23. A part of a surface of the insulating layer 31a is exposed through the opening OP.

Figure 5A:
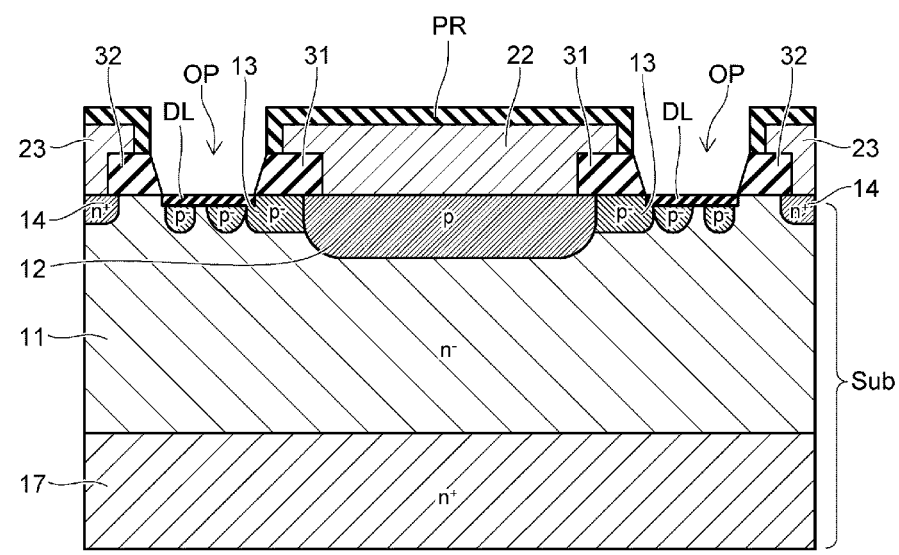
FIGS. 5A and 5B are cross-sectional views depicting aspects of a manufacturing process of a semiconductor device according to an embodiment.

As shown in FIG. 5A, the resist PR is used as a mask, and a part of the insulating layer 31a is removed by RIE. In RIE, for example, a gas that contains, for example, a fluorine-based gas (for example, $CHF_3$) is used. Accordingly, the insulating layer 31a is divided into the first insulating layer 31 and the second insulating layer 32. When RIE is performed, a damage layer DL is formed on the surface of the semiconductor substrate Sub.

By removing a part of the insulating layer 31a by RIE, the taper of the side surfaces of the first insulating layer 31 and the second insulating layer 32 can be reduced. For example, an angle between the side surfaces of the first insulating layer 31 and the second insulating layer 32 and the X-Y plane can be increased as compared with a case where a part of the insulating layer 31a is removed by wet etching.

Figure 5B:
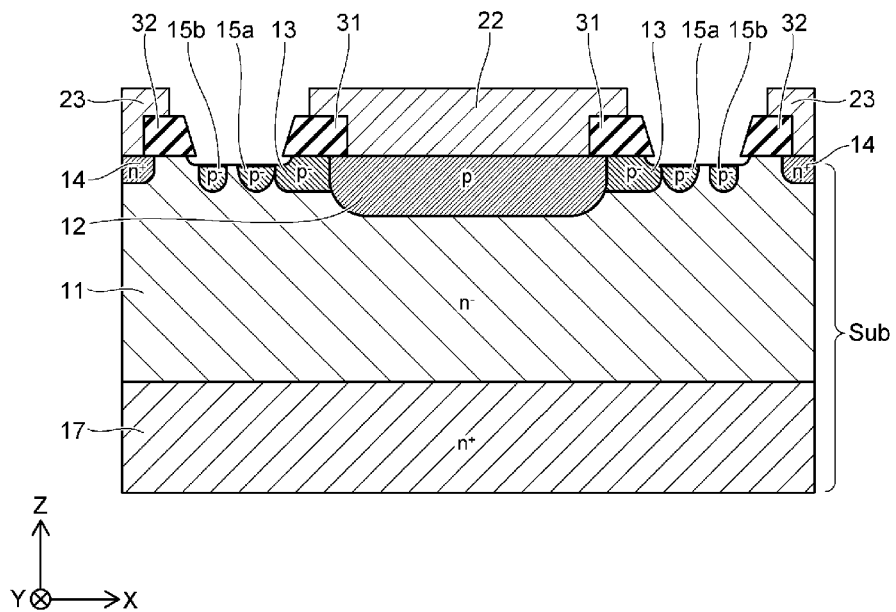

The resist PR is removed by asking using oxygen gas. The damage layer DL of the semiconductor substrate Sub is removed by chemical dry etching (CDE). In CDE, for example, a gas that contains carbon tetrafluoride ($CF_4$) and oxygen ($O_2$) is used. At this time, a part of the surface of the semiconductor substrate Sub exposed to the gas is isotropically etched. In order to remove residues and reaction products generated by CDE, the semiconductor substrate Sub is cleaned by using DHF. FIG. 5B shows a state after cleaning. Since the surface of the semiconductor substrate Sub is isotropically etched by CDE, a gap is formed between an end portion of the first insulating layer 31 in the radial direction and the semiconductor substrate Sub.

Figure 6:
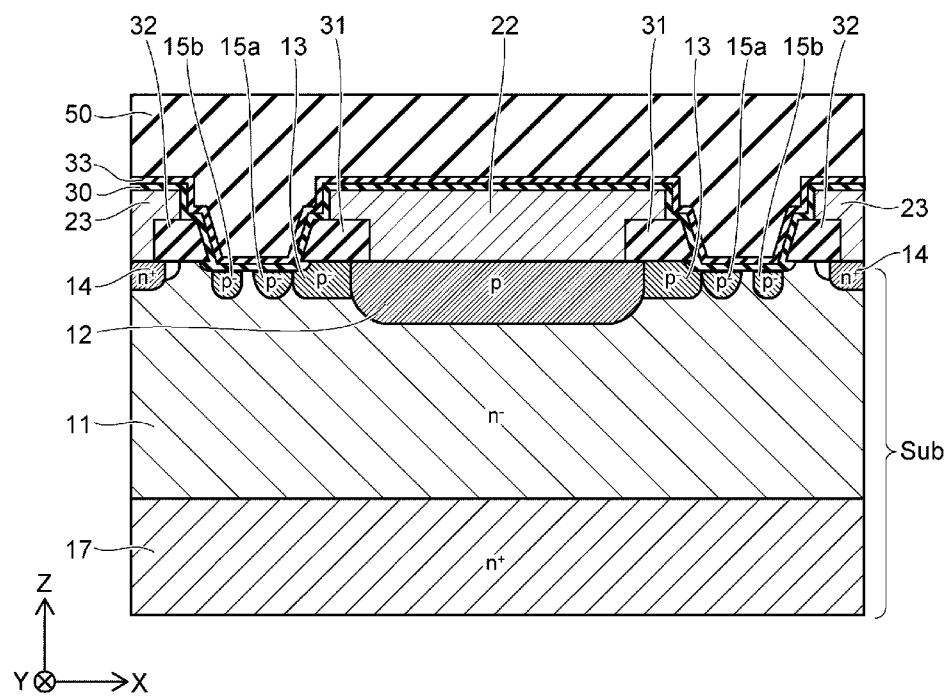
FIG. 6 is a cross-sectional view depicting aspects of a manufacturing process of a semiconductor device according to an embodiment.

The semi-insulating layer 30 and the third insulating layer 33 that cover the upper electrode 22, the EQPR electrode 23, the first insulating layer 31, and the second insulating layer 32 are sequentially formed by CVD. As shown in FIG. 6, the sealing portion 50 is formed above the third insulating layer 33. A lower surface of the semiconductor substrate Sub is polished until the $n^+$ type semiconductor region 17 has a predetermined thickness. The lower electrode 21 is formed on the lower surface of the polished semiconductor substrate Sub by sputtering. Apart of the sealing portion 50, a part of the third insulating layer 33, and a part of the semi-insulating layer 30 are removed such that the upper electrode 22 is exposed. The semiconductor device 100 according to the embodiment is manufactured by the processes described above.

Effects of an embodiment will be described with reference to FIG. 7.

Figure 7:
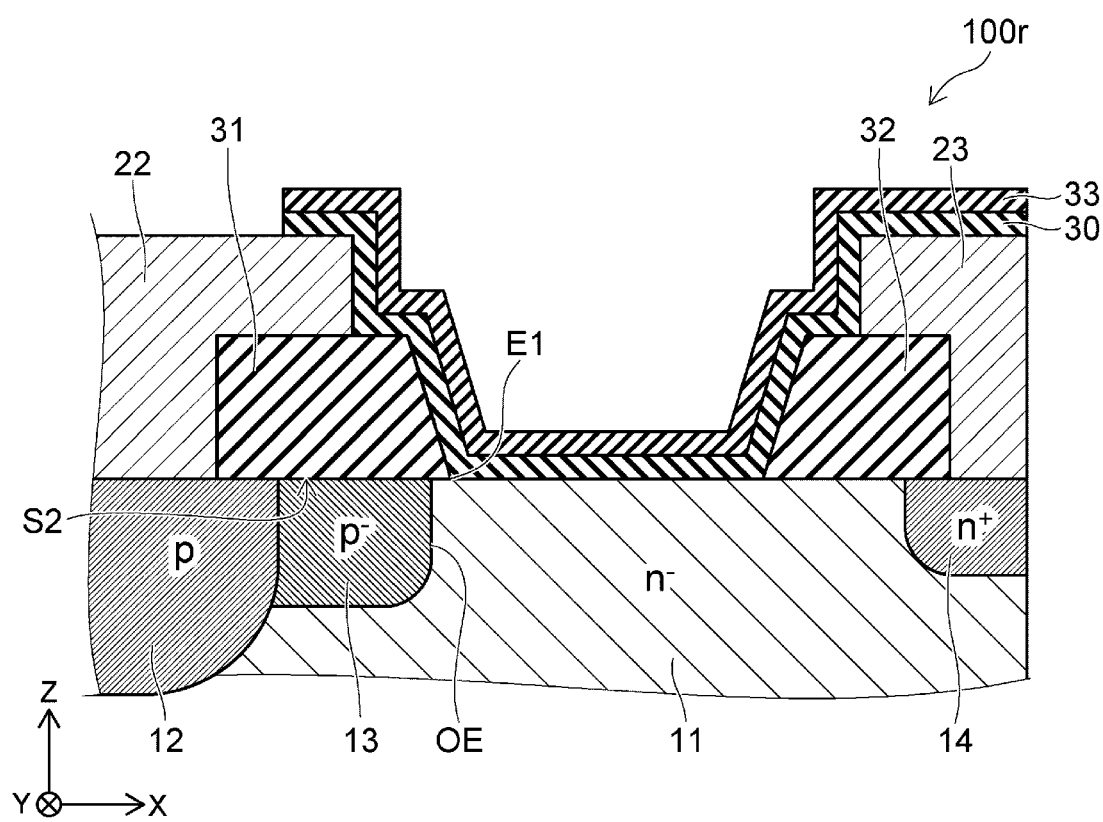
FIG. 7 is a cross-sectional view of portion of a semiconductor device according to a comparative example.

FIG. 7 is a cross-sectional view showing a part of a semiconductor device according to a comparative example.

In the semiconductor device 100r shown in FIG. 7, the first end portion E1 of the second lower surface S2 is located beyond (past the outer edge OE in the X direction) the $p^-$ type RESURF region 13. The first end portion E1 is directly opposed to the $n^-$ type semiconductor region 11 in the Z direction, and is in contact with the upper surface of the $n^-$ type semiconductor region 11.

In the semiconductor devices 100, 100r, a strong electric field is generated at an interface between the $n^-$ type semiconductor region 11 and the p type semiconductor region 12 and at an interface between the $n^-$ type semiconductor region 11 and the $p^-$ type RESURF region 13 at the time of breakdown voltage testing or the like. When carriers in the semiconductor layer 10 are accelerated by this electric field, the "hot" carriers having a large energy are generated.

When entering the first insulating layer 31, these hot carriers are trapped by the first insulating layer 31. An increase of trapped carriers in the first insulating layer 31 affects how the depletion layer spreads from the p type semiconductor region 12 to the $n^+$ type semiconductor region 14. As a result of these trapped carriers, the breakdown voltage of the semiconductor device decreases.

In the semiconductor device 100r according to the comparative example, the first end portion E1 is located outside the $p^-$ type RESURF region 13. In other words, the first insulating layer 31 is provided above the outer edge OE of the $p^-$ type RESURF region 13. In the semiconductor device 100r, the carriers accelerated between the $p^-$ type RESURF region 13 and the $n^-$ type semiconductor region 11 easily enter the first insulating layer 31. Therefore, the breakdown voltage of the semiconductor device 100r is decreased due to the application of the voltage.

In the semiconductor device 100, the first end portion E1 is provided above the $p^-$ type RESURF region 13 rather than beyond the outer edge. In other words, the first insulating layer 31 does not overlap the outer edge of the $p^-$ type RESURF region 13 in the semiconductor device 100. The carriers accelerated between the $p^-$ type RESURF region 13 and the $n^-$ type semiconductor region 11 thus enter the semi-insulating layer 30. The carriers that enter the semi-insulating layer 30 will flow to the upper electrode 22 or the EQPR electrode 23 according to carrier polarity. Therefore, trapping of the carriers in the first insulating layer 31 can be prevented. Accordingly, a decrease in the breakdown voltage of the semiconductor device 100 can be prevented.

In the semiconductor device 100, the first end portion E1 of the second lower surface S2 is spaced away from, for example, the semiconductor layer 10 in the Z direction. A part of the semi-insulating layer 30 is provided between the first end portion E1 and the semiconductor layer 10. According to this configuration, as compared with a case where the first end portion E1 is spaced away from the semiconductor layer 10 and an insulative gap is left between the first end portion E1 and the semiconductor layer 10, the hot carriers generated in the semiconductor layer 10 are easily discharged to the upper electrode 22 or the EQPR electrode 23.

In the semiconductor device 100, the distance D1 shown in FIG. 3 is preferably less than or equal to 15 μm. By setting the distance D1 to 15 μm or less, the first end portion E1 can be further away from the interface between the p⁻ type RESURF region 13 and the n⁻ type semiconductor region 11. Accordingly, the trapping of the carriers in the first insulating layer 31 can be further prevented. More preferably, the distance D1 is less than or equal to 10 μm.

An angle θ1 (see FIG. 3) between the second lower surface S2 and the side surface S3 is preferably more than or equal to 50 degrees. By setting the angle θ1 to 50 degrees or more, the first end portion E1 can be further away from the interface between the p⁻ type RESURF region 13 and the n⁻ type semiconductor region 11. Accordingly, the trapping of the carriers in the first insulating layer 31 can be further prevented.

The distance D2 is preferably greater than or equal to 50 nm and less than or equal to 150 nm. By manufacturing the semiconductor device 100 such that the distance D2 is greater than or equal to 50 nm and less than or equal to 150 nm, the damage layer DL (see FIG. 5) can be removed and decrease in the breakdown voltage due to the p⁻ type RESURF region 13, the p⁻ type guard ring region 15a, and the p⁻ type guard ring region 15b being etched can be reduced. Further, a decrease in step coverage at the time of forming the semi-insulating layer 30 is prevented, and the upper electrode 22 and the EQPR electrode 23 can be electrically connected more reliably via the semi-insulating layer 30.

Figure 8:
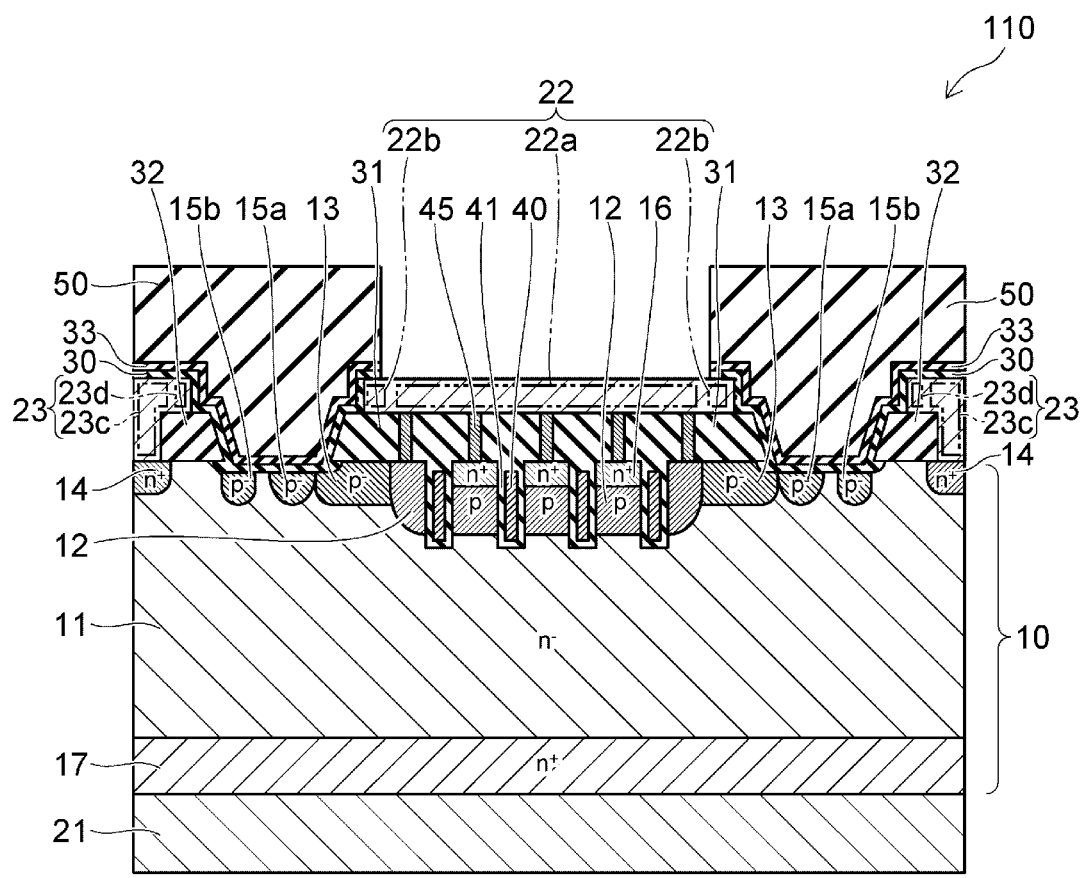
FIG. 8 is a cross-sectional view showing a semiconductor device according to a modification of an embodiment.
Figure 9:
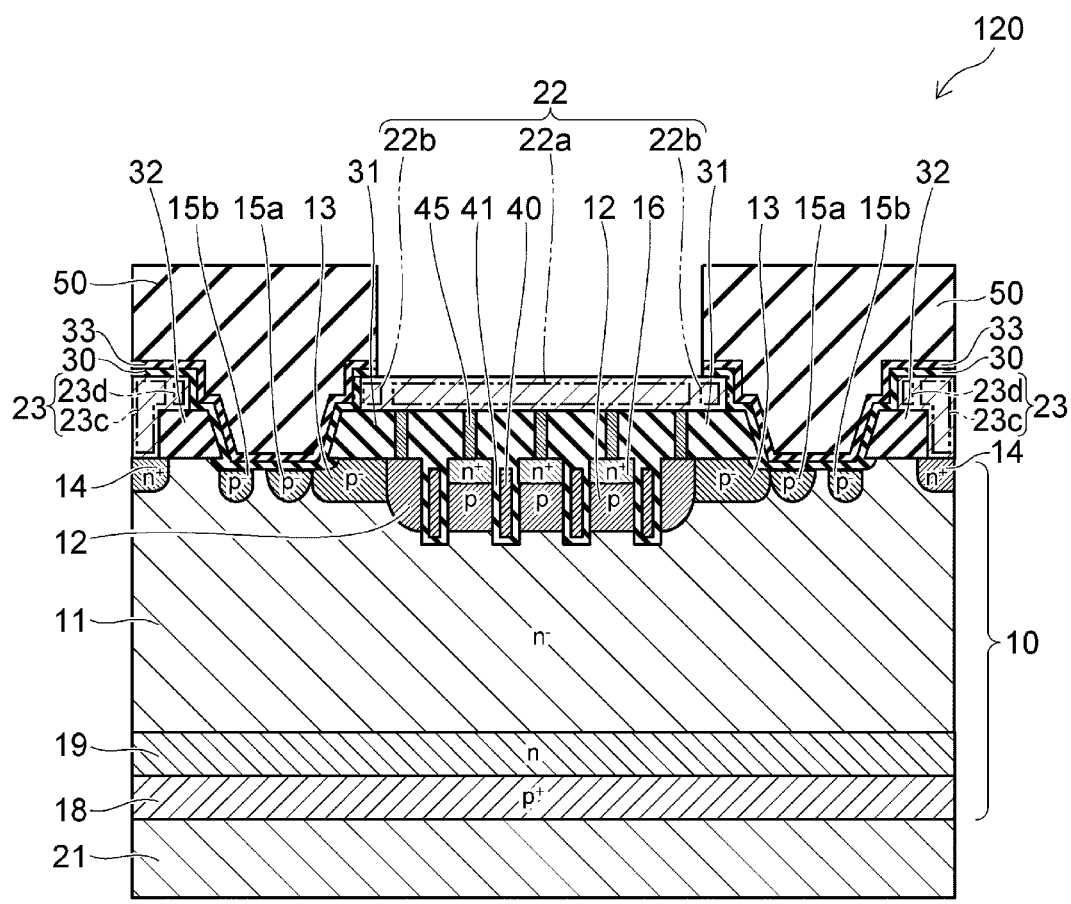
FIG. 9 is a cross-sectional view showing a semiconductor device according to a modification of an embodiment.

FIGS. 8 and 9 are cross-sectional views showing a semiconductor device according to a modification of an embodiment.

The semiconductor device 110 shown in FIG. 8 is a MOSFET. As compared with the semiconductor device 100, the semiconductor device 110 further includes a gate electrode 40, a gate insulating layer 41, and a plug 45. In addition, the semiconductor layer 10 further includes an n⁺ type semiconductor region 16 (sixth semiconductor region).

The n⁺ type semiconductor region 16 is selectively provided above the p type semiconductor region 12. In the example shown in FIG. 8, n⁺ type semiconductor regions 16 are alternately provided along the Y direction with p type semiconductor regions between adjacent gate electrodes 40.

The first insulating layer 31 is provided above the n⁺ type semiconductor region 16 and the gate electrode 40 in addition to the outer periphery of the p type semiconductor region 12. The upper electrode 22 is provided above the first insulating layer 31 and is electrically connected to the p type semiconductor region 12 and the n⁺ type semiconductor region 16 via the plugs 45.

In the semiconductor device 110, the upper electrode 22 includes the first electrode portion 22a and the second electrode portion 22b as in the semiconductor device 100. The first electrode portion 22a is provided above a plurality of p type semiconductor regions 12. When viewed from the Z direction, the first electrode portion 22a overlaps the plurality of p type semiconductor regions 12. The second electrode portion 22b is provided surrounding the first electrode portion 22a in an X-Y plane. The first insulating layer 31 is provided between the semiconductor layer 10 and the second electrode portion 22b.

The gate electrode 40 faces the n⁻ type semiconductor region 11, the p type semiconductor region 12, and the n⁺ type semiconductor region 16 via the gate insulating layer 41. The first insulating layer 31 is provided between the upper electrode 22 and the gate electrode 40, and these electrodes are electrically isolated from each other.

FIG. 9 is a cross-sectional view showing a semiconductor device according to a second modification of an embodiment.

A semiconductor device 120 shown in FIG. 9 is an IGBT. The semiconductor device 120 is different from the semiconductor device 110 in that the semiconductor device 120 includes a p⁺ type collector region 18 and an n type buffer region 19 instead of the n type semiconductor region 17.

In the semiconductor devices shown in FIGS. 8 and 9, the trapping of the carriers in the first insulating layer 31 can be prevented by providing the first end portion of the lower surface of the first insulating layer 31 above the p⁻ type RESURF region 13. Accordingly, a decrease in the breakdown voltage can be prevented.

The semiconductor device 110 and the semiconductor device 120 shown in FIGS. 8 and 9 have a trench gate type structure in which the gate electrode 40 is provided in the semiconductor layer 10. Alternatively, the semiconductor device 110 and the semiconductor device 120 may have a planar gate structure in which the gate electrode 40 is provided above the semiconductor layer 10.

While certain embodiments have been described, these embodiments have been presented by way of example only, and are not intended to limit the scope of the present disclosure. Indeed, the novel embodiments described herein may be embodied in a variety of other forms; furthermore, various omissions, substitutions and changes in the form of the embodiments described herein may be made without departing from the spirit of the present disclosure. The accompanying claims and their equivalents are intended to cover such forms or modifications as would fall within the scope and spirit of the present disclosure.

What is claimed is:

1. A semiconductor device, comprising:
a first electrode;
a semiconductor layer on the first electrode and including:
a first region of a first conductivity type electrically connected to the first electrode;
a second region of a second conductivity type on the first region at a first surface of the semiconductor layer;
a third region of the second conductivity type at the first surface and contacting the second region, the third region surrounding the second region in a first plane parallel to the first surface and having an impurity concentration less than that of the second region; and
a fourth region of the first conductivity type at the first surface and surrounding the third region in the first plane, the fourth region being spaced from the third region in a first direction that is parallel to the first plane and having an impurity concentration greater than that of the first region;
a second electrode on the first surface and electrically connected to the second region, the second electrode including a first portion above the second region in a second direction that is orthogonal to the first plane and a second portion surrounding the first portion in a second plane parallel to the first plane;
a third electrode on the first surface and surrounding the second electrode in the second plane, the third electrode being spaced from the second electrode in the first direction and electrically connected to the fourth region;

a semi-insulating layer contacting the first region at the first surface between the second and fourth regions, the semi-insulating layer contacting the second electrode and the third electrode; and a first insulating layer between the second portion and the third region in the second direction and contacting the first surface, a first end portion of the first insulating layer that is spaced from the second electrode in the first direction towards the third electrode is above the third region in the second direction.

2. The semiconductor device according to claim 1, wherein the semi-insulating layer is between the first end portion and the third region in the second direction.

3. The semiconductor device according to claim 2, wherein the semiconductor layer further comprises:

a fifth region of the second conductivity type surrounding the third region in a third plane parallel to the first plane and being between the third region and the fourth region in the first direction, the fifth region having an impurity concentration less than that of the second region, contacting the semi-insulating layer and spaced from the fourth region in the first direction.

4. The semiconductor device according to claim 1, wherein the semiconductor layer further comprises:

a fifth region of the second conductivity type surrounding the third region in a third plane parallel to the first plane and being between the third region and the fourth region in the first direction, the fifth region having an impurity concentration less than that of the second region, contacting the semi-insulating layer and spaced from the fourth region in the first direction.

5. The semiconductor device according to claim 1, wherein the second portion of the second electrode overlaps the first insulating layer in the second direction.

6. The semiconductor device according to claim 1, wherein an outer edge of the second portion of the second electrode in the first direction is above, in the second direction, an interior portion of the first insulating layer.

7. The semiconductor device according to claim 6, wherein a distance between the interior portion and the first end portion of the first insulating film in the first direction is less than or equal to 15 μm.

8. The semiconductor device according to claim 1, wherein an interior angle of the first insulating film at the first end portion is greater than or equal to 50 degrees.

9. The semiconductor device according to claim 1, wherein the semi-insulating layer extends into the semiconductor layer in the second direction to a distance less than or equal to 150 nm but greater than or equal to 50 nm.

10. The semiconductor device according to claim 1, further comprising:

a gate electrode below the second electrode in the second direction;

a sixth region of the semiconductor layer, the sixth region being of the first conductivity type, between the second region and the second electrode, and electrically connected to the second electrode;

a gate insulating film between the gate electrode and the first, second, and sixth regions, wherein the gate electrode is adjacent to, via the gate insulating film, the first region, second region, and sixth regions.

11. The semiconductor device according to claim 10, further comprising:

a semiconductor region of the first conductivity type in the semiconductor layer between the first electrode and the first region of the semiconductor layer and contacting the first electrode, the semiconductor region have an impurity concentration greater than the first region.

12. The semiconductor device according to claim 10, further comprising:

a semiconductor region of the second conductivity type in the semiconductor layer between the first electrode and the first region of the semiconductor layer and contacting the first electrode, the semiconductor region have an impurity concentration greater than the second region.

13. The semiconductor device according to claim 1, further comprising:

a second insulating layer covering the semi-insulating layer.

14. A semiconductor device, comprising:

a first electrode;

a first semiconductor region of a first conductivity type on the first electrode;

a second semiconductor region of a second conductivity type on the first semiconductor region;

a second electrode on a first surface of the second semiconductor region, the first and second semiconductor regions being between the first and second electrodes in a first direction;

a third semiconductor region of the second conductivity type on the first semiconductor region and adjacent to second semiconductor region in a second direction intersecting the first direction, an impurity concentration of the third semiconductor region being less than that of the second semiconductor region;

a fourth semiconductor region of the first conductivity type on the first semiconductor region, a portion of the first semiconductor region being between third and the fourth semiconductor regions in the second direction, an impurity concentration of the fourth semiconductor region being greater than that of the first semiconductor region;

a third electrode contacting the fourth semiconductor region;

a first insulating layer on the third semiconductor region, the first insulating layer surrounding a first portion of the second electrode in a first plane parallel to the first surface, a second portion of the second electrode being above the first insulating layer in the first direction, an outer edge of the first insulating layer extending in the second direction beyond an outer edge of the second portion of the second electrode; and a semi-insulating layer contacting the second electrode, the first insulating layer, the third semiconductor region, the first semiconductor region, and the third electrode, a portion of the semi-insulating layer being between the outer edge of the first insulating layer and the third semiconductor region in the first direction.

15. The semiconductor device according to claim 14, wherein the semi-insulating layer extends into the first semiconductor region.

16. The semiconductor device according to claim 14, wherein the semi-insulating layer has a resistivity of greater than or equal to $1.0 \times 10^8$ [Ω·cm] but less than $1.0 \times 10^{13}$ [Ω·cm].

17. The semiconductor device according to claim 14, wherein the semi-insulating layer contacts the first semiconductor region at a surface between the third and the fourth semiconductor regions.

18. A semiconductor device, comprising:
a first electrode;
a semiconductor layer on the first electrode and including:
- a first region of a first conductivity type electrically connected to the first electrode;
- a second region of a second conductivity type on the first region at a first surface of the semiconductor layer;
- a third region of the second conductivity type at the first surface and contacting the second region, the third region surrounding the second region in a first plane parallel to the first surface and having an impurity concentration less than that of the second region;
- a fourth region of the first conductivity type at the first surface and surrounding the third region in the first plane, the fourth region being spaced from the third region in a first direction that is parallel to the first plane and having an impurity concentration greater than that of the first region; and
- a plurality of fifth regions of the first conductivity type on the second region spaced from one another in the first direction;

a second electrode electrically connected to the second region, the second electrode including a first portion above the second region in a second direction that is orthogonal to the first plane and a second portion surrounding the first portion in a second plane parallel to the first plane;
a plurality of gate electrodes below the second electrode in the second direction, each gate electrode contacting the first region, the second region, and the fifth region via a gate insulating layer;
a third electrode on the first surface and surrounding the second electrode in the second plane, the third electrode being spaced from the second electrode in the first direction and electrically connected to the fourth region;
a semi-insulating layer contacting the first region at the first surface between the third and fourth regions, the semi-insulating layer contacting the second electrode and the third electrode; and
a first insulating layer between the second portion and the third region in the second direction and contacting the first surface, a first end portion of the first insulating layer that is spaced from the second electrode in the first direction towards the third electrode is above the third region in the second direction, wherein
the fifth regions are each electrically connected to the second electrode by contact plugs extending through the first insulating film.

19. The semiconductor device according to claim 18, further comprising:
a semiconductor region of the first conductivity type in the semiconductor layer between the first electrode and the first region of the semiconductor layer and contacting the first electrode, the semiconductor region have an impurity concentration greater than the first region.

20. The semiconductor device according to claim 18, further comprising:
a semiconductor region of the second conductivity type in the semiconductor layer between the first electrode and the first region of the semiconductor layer and contacting the first electrode, the semiconductor region have an impurity concentration greater than the second region.

* * * * *